United States Patent [19]

Suzuki

[11] 4,137,628
[45] Feb. 6, 1979

[54] METHOD OF MANUFACTURING CONNECTION-TYPE CERAMIC PACKAGES FOR INTEGRATED CIRCUITS

[75] Inventor: Go Suzuki, Nagoya, Japan

[73] Assignee: NGK Insulators, Ltd., Nagoya, Japan

[21] Appl. No.: 862,271

[22] Filed: Dec. 19, 1977

[30] Foreign Application Priority Data

Dec. 28, 1976 [JP] Japan ............................. 52-157341

[51] Int. Cl.$^2$ ..................... H05K 3/22; H05K 3/10
[52] U.S. Cl. ............................... 29/625; 29/411;
174/68.5; 264/58; 264/61; 264/67; 156/89
[58] Field of Search ............... 29/625, 626, 628, 411;
174/68.5, 52 FP; 361/414; 264/58, 61, 67;
156/89

[56] References Cited

U.S. PATENT DOCUMENTS

| T888,004 | 7/1971 | Keller | 156/89 |
|---|---|---|---|
| 3,189,978 | 6/1965 | Stetson | 264/61 |
| 3,235,939 | 2/1966 | Rodriquez et al. | 29/625 |
| 3,518,756 | 7/1970 | Bennett et al. | 264/61 |
| 3,613,228 | 10/1971 | Cook et al. | 29/411 |
| 3,815,187 | 6/1974 | Hanold | 29/625 |
| 3,926,746 | 12/1975 | Hargis | 29/418 |

OTHER PUBLICATIONS

Schwartz, B., et al., "Laminated Ceramics," from *Ceramic Age, The Total Ceramic Spectrum*, vol. 83, No. 6, Jun. 1967, pp. 40–44, pp. 29–625.

Primary Examiner—C.W. Lanham
Assistant Examiner—Daniel C. Crane
Attorney, Agent, or Firm—Stevens, Davis, Miller & Mosher

[57] ABSTRACT

A method of manufacturing connection-type ceramic packages for integrated circuits is disclosed. A plurality of green ceramic sheets are prepared and punched to form notches in each sheet and recesses defining cavities for accommodating an integrated circuit element therein at predetermined positions in given sheets. A plurality of lead array patterns each corresponding to terminal areas of the element are printed on each surface of the sheets with a metallizing ink. The printed sheets are laminated one upon another while aligning with the aid of the notches under hot pressed condition to form a laminated body. The laminated body is longitudinally cut into a plurality of green ceramic strips while providing transverse snap lines for obtaining individual ceramic package units. A pattern corresponding to the lead array pattern is printed on both sides of each of the strips with a metallizing ink. The printed strip is sintered to ceramic strip, which is then subjected to a usual plating treatment. Thereafter, lead members are attached to the plated ceramic strip to form connection-type ceramic packages capable of being divided into individual ceramic package units.

4 Claims, 8 Drawing Figures

FIG_3

FIG_5

FIG.7
FIG.8
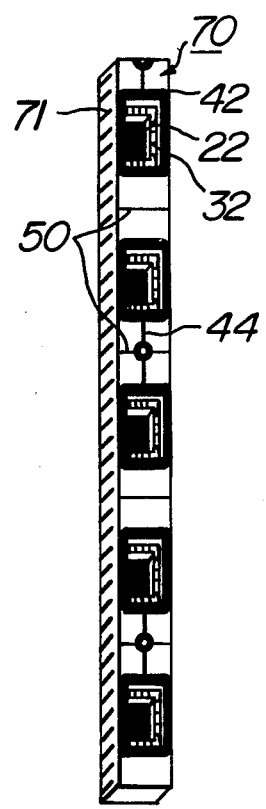
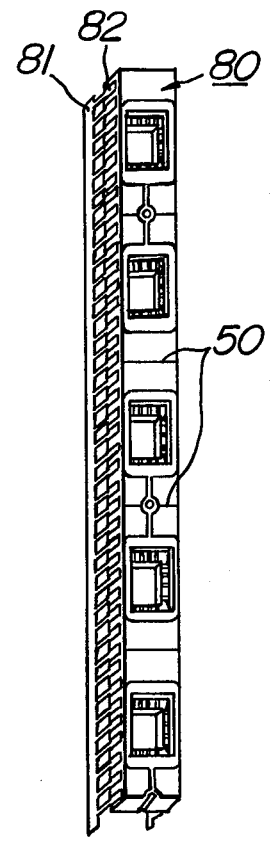

METHOD OF MANUFACTURING CONNECTION-TYPE CERAMIC PACKAGES FOR INTEGRATED CIRCUITS

BACKGROUND OF THE INVENTION

1. Field of the Invention

The present invention relates to a method of manufacturing connection-type ceramic packages for integrated circuits.

2. Description of the Prior Art

Recently, there has been demanded a structure capable of providing a large number of lead members in the package for semiconductor integrated circuit in association with the large scale integration of such circuit. For this purpose, various packages made of different materials have hitherto been proposed and above all, vessels formed by stacking a plurality of ceramic sheets one upon another are used widely.

This type of the ceramic package is usually manufactured as follows: that is, there are prepared a plurality of unsintered soft ceramic sheets, each sheet being generally called as a green sheet. Among them, some given green sheets are punched at predetermined positions to provide cavities for accommodating integrated circuit elements therein. On the surface of each of these green sheets are printed a plurality of patterns of lead array, each pattern corresponding to terminal areas of the integrated circuit element at predetermined positions. Then, these printed green sheets are laminated one upon another and thereafter the resulting laminated body is sintered at a high temperature. In this method, however, a great amount of skill is required for printing the lead array pattern on the surface of the green sheet because such lead array pattern becomes considerably complicated due to the increase of the number of the terminal areas accompanied with the large scale integration. And also, the feature of separately and independently printing the lead array patterns on the green sheet brings about the decrease of yield per unit area of green sheet and is uneconomical. Moreover, there are many inconveniences in the handling, packing and use because the shape of the product is very small.

SUMMARY OF THE INVENTION

It is, therefore, an object of the present invention to eliminate the above drawbacks of the conventional ceramic package for integrated circuit.

According to the present invention, there is provided a method of manufacturing a connection-type ceramic packages for integrated circuits, each package having a cavity for accommodating an integrated circuit element therein, which comprises the steps of (a) preparing a plurality of green ceramic sheets to be laminated;

(b) punching said green ceramic sheets to form notches for determining a working position in each sheet and recesses each defining said cavity at predetermined positions in each of given green ceramic sheets;

(c) printing a plurality of patterns of lead array, each pattern corresponding to terminal areas of said integrated circuit element, on the surface of each of the green ceramic sheets with a metallizing ink;

(d) laminating these printed green ceramic sheets one upon another while aligning said green ceramic sheets with the aid of said notches under hot pressed condition to form a green ceramic laminated body;

(e) providing transverse snap lines for obtaining individual ceramic package units on the surface of said laminated body and at the same time longitudinally cutting said laminated body into a plurality of green ceramic strips each constituting a plurality of said individual ceramic package units which are connected with each other;

(f) printing a pattern corresponding to said lead array pattern on both sides of each of said green ceramic strips with a metallizing ink;

(g) sintering said green ceramic strips to ceramic strips;

(h) subjecting said ceramic strips to a usual plating treatment; and (i) attaching lead members of each of said plated ceramic strips to form connection-type ceramic packages capable of being divided into individual ceramic package units in use.

BRIEF DESCRIPTION OF THE DRAWINGS

The invention will now be described with reference to the accompanying drawings, wherein:

FIG. 7 is a perspective view of a green ceramic strip obtained at the side-printing step following to the cutting of the laminated body according to the present invention; and FIG. 8 is a perspective view of connection-type ceramic packages manufactured by the method of the present invention.

DESCRIPTION OF THE PREFERRED EMBODIMENT

Figure 1:
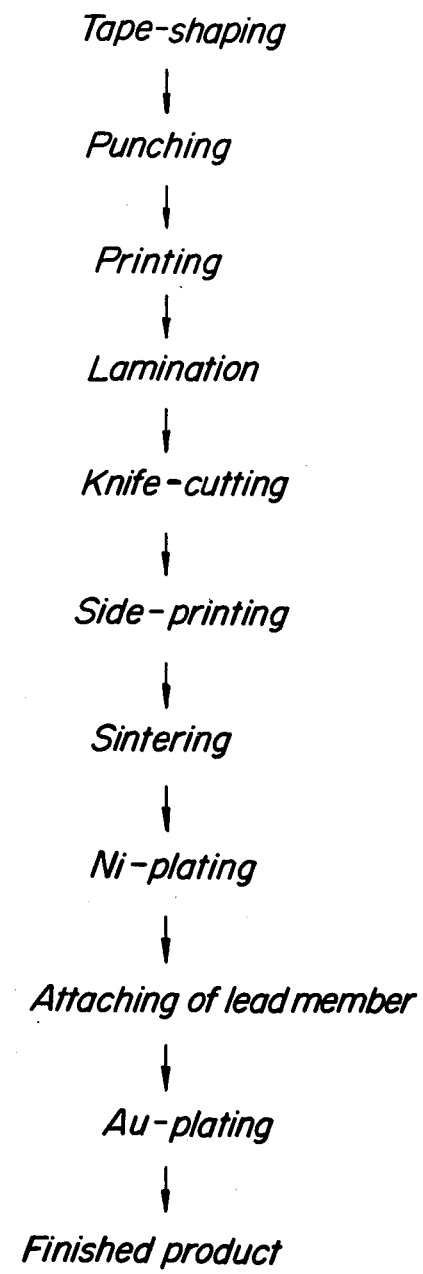
FIG. 1 is a flow diagram for carrying out the method of the present invention.

The present invention will successively be described every steps in accordance with the flow diagram shown in FIG. 1. First, a ceramic slurry is prepared by mixing alumina powder, flux, organic binder, plasticizer and solvent at a given mixing ratio in the conventional manner. Then, the slurry is shaped into a tape by means of a tape caster and thereafter the resulting tape is dried and cut in a given length to form a plurality of unsintered soft ceramic sheets or so-called "green ceramic sheets". Several green ceramic sheets thus obtained are put one upon another and then punched by a suitable punching means to form notches for determining a working position in each sheet so as to avoid the shifting of the sheets at subsequent lamination step. At the same time, recesses each defining a cavity for accommodating an integrated circuit therein are formed in each of given green ceramic sheets, which are selected from all the sheets so as to produce the cavity corresponding to the thickness of the integrated circuit element in the formation of the laminated body, at predetermined positions corresponding to individual ceramic package units.

Next, a plurality of patterns of lead array, each pattern corresponding to terminal areas of the integrated circuit element to be accommodated, are printed on the surface of each of the green ceramic sheets with a metallizing ink by a screen printing process. As the metallizing ink, use may be made of tungsten paste, molybdenum paste and the like, which are usually used in the art. A typical example of the lead array pattern printed on the surface of each of the green ceramic sheets is shown in FIGS. 2-5 wherein the lead array pattern corresponding to 16 terminal areas of the integrated circuit element is printed lengthwise and breadthwise in a connective state capable of being divided into individual ceramic package units through snap lines provided by subsequent knife cutting step. Moreover, if it is intended to accommodate an integrated circuit element having a more terminal areas obtained by, for example, the large scale integration into the ceramic package unit, the lead array pattern corresponding to such increased number of the terminal areas can easily be printed by the conventional photographical process or the like.

Figure 2:
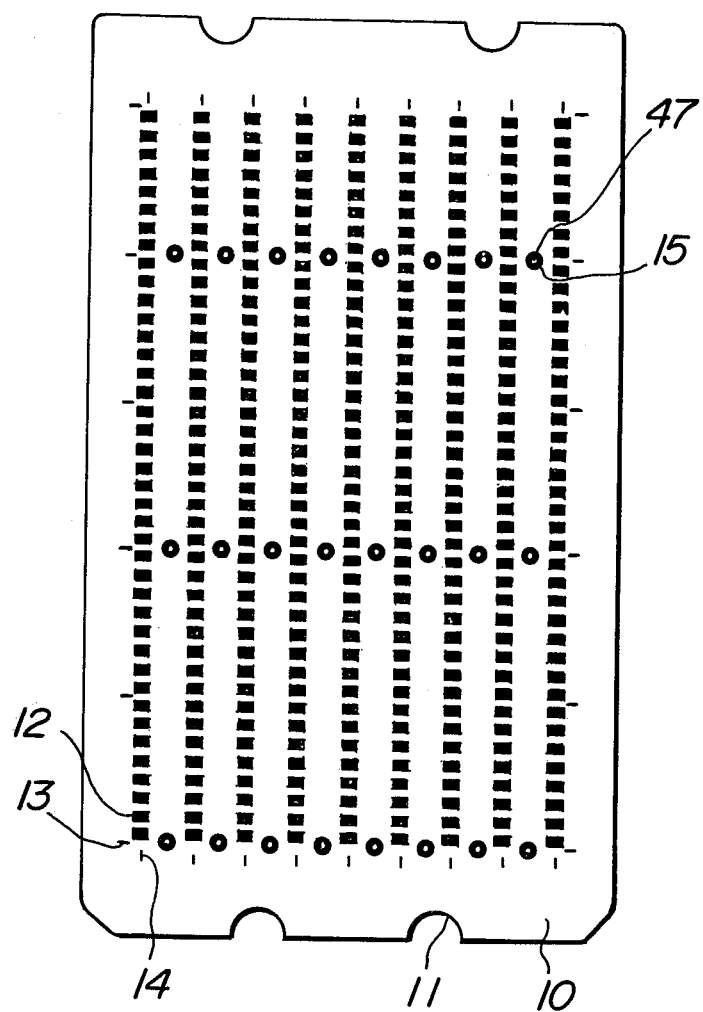
FIG. 2 is a bottom plan view of a first green ceramic sheet having a terminal pattern obtained at the printing step according to the present invention.

The pattern shown in FIG. 2 is a terminal pattern printed on a bottom surface of a first green ceramic sheet 10 which is located as a lowest layer in the formation of the laminate. This terminal pattern comprises metallized layers 12 constituting terminal portions of the lead array pattern corresponding to the number of the terminal areas of the integrated circuit element to be accommodated, metallized marks 13 for the formation of snap lines capable of being divided into individual ceramic package units at subsequent knife cutting step, and another metallized marks 14 for the formation of green ceramic strips by longitudinally cutting the laminated body at the knife cutting step, which are provided at predetermined positions on the bottom surface of the first green ceramic sheet 10. Moreover, there are provided metallized layers 15 which are electrically connected to metallized layers for auxiliary lead members formed on a second green ceramic sheet through holes 47 opened by punching. In both ends of the first green ceramic sheet 10 are formed notches 11 by punching.

Figure 3:
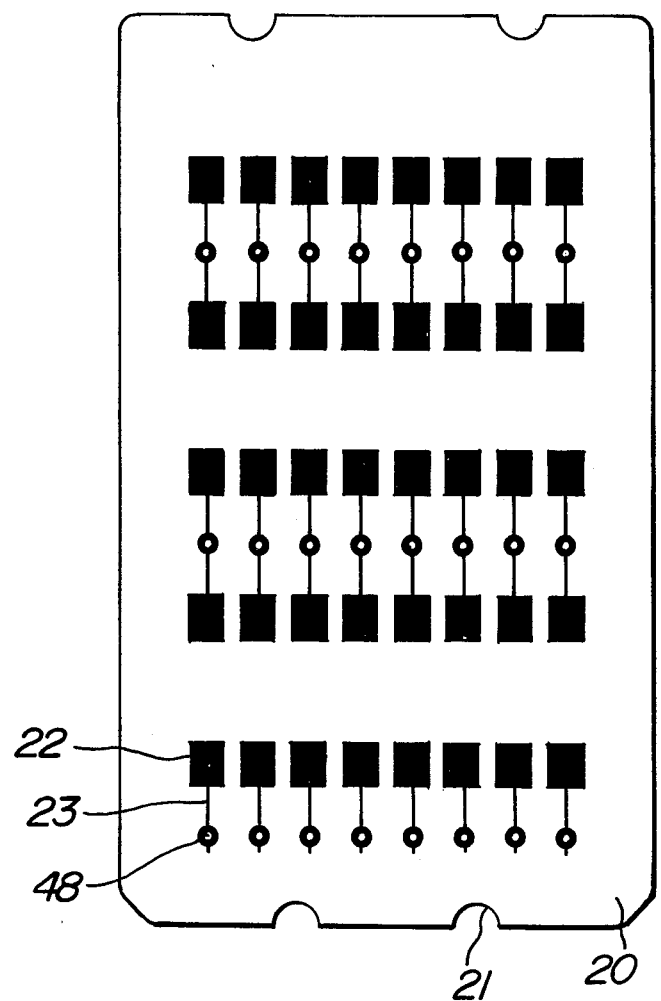
FIG. 3 is a plan view of a second green ceramic sheet having a mount pattern obtained at the printing step according to the present invention.

The pattern shown in FIG. 3 is a mount pattern printed on an upper surface of a second green ceramic sheet 20 positioning on the first green ceramic sheet 10 in the formation of the laminate. This mount pattern comprises metallized layers 22 constituting mount portions for placing the integrated circuit element, and another metallized layers 23 for auxiliary lead members which extend from the metallized layers 22 and are electrically connected to the metallized layers 15 of the first green ceramic sheet 10 through holes 48 in register with the holes 47 so as to plate the layers 23 at subsequent plating step. In both ends of the second green ceramic sheet 20 are formed notches 21 by punching.

Figure 4:
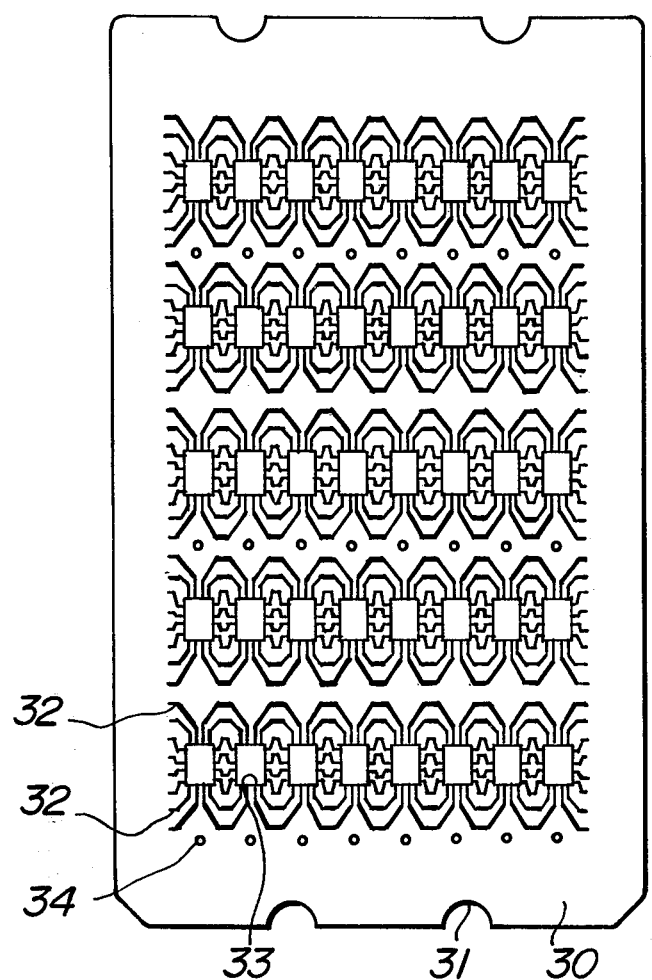
FIG. 4 is a plan view of a third green ceramic sheet having a figure pattern obtained at the printing step according to the present invention.

The pattern shown in FIG. 4 is a figure pattern of lead distribution corresponding to the terminal areas of the integrated circuit element which is printed on an upper surface of a third green ceramic sheet 30 positioning on the second green ceramic sheet 20 in the formation of the laminate. This figure pattern comprises metallized layers 32 constituting the lead distribution corresponding to the terminal areas of the integrated circuit element to be accommodated. Upon punching, notches 31 are formed in both ends of the third green ceramic sheet 30 and at the same time, recesses defining a part of the cavity for accommodating the integrated circuit element therein and holes 34 in register with the holes 47 of the first green ceramic sheet and the holes 48 of the second green ceramic sheet are provided at predetermined positions.

Figure 5:
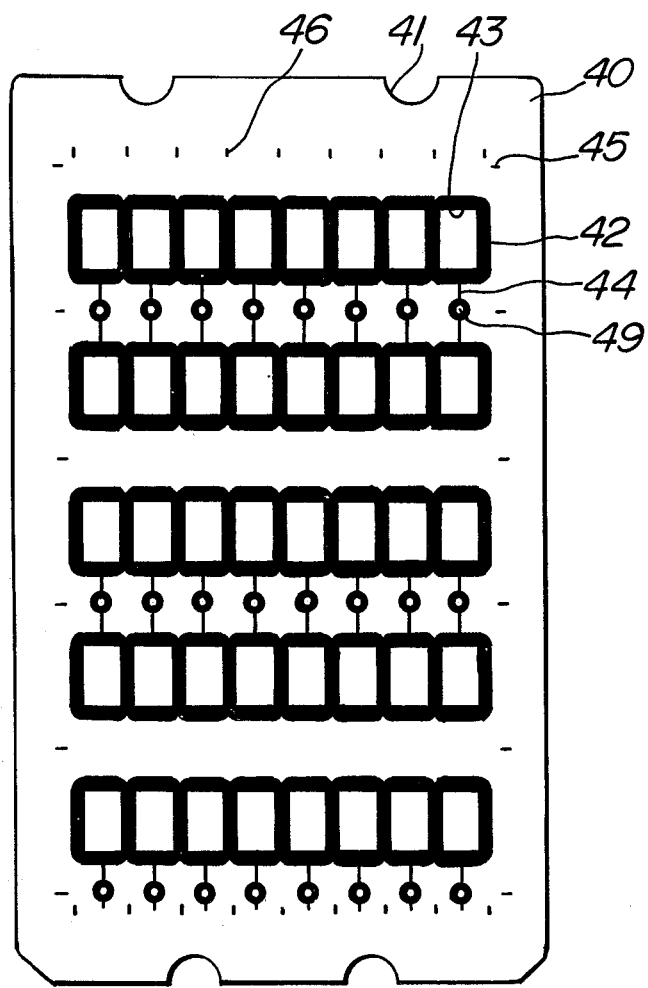
FIG. 5 is a plan view of a fourth green ceramic sheet having a seal-ring pattern obtained at the printing step according to the present invention.

The pattern shown in FIG. 5 is a seal-ring pattern printed on an upper surface of a fourth green ceramic sheet 40 positioning on the third green ceramic sheet 30 as a highest layer in the formation of the laminate. This seal-ring pattern is used for the sealing of the cavity after the integrated circuit element is accommodated in the cavity, and comprises metallized layers 42 constituting the seal rings. Upon punching, notches 41 are formed in both ends of the fourth green ceramic sheet 40 and also recesses 43 defining a part of the cavity are provided at predetermined positions.

The recesses 43 form the cavities for accommodating the integrated circuit elements therein together with the corresponding recesses 33 of the third green ceramic sheet 30. However, the opening area of the recess 43 should be larger than that of the recess 33 in order to ensure the connection of the terminal area of the integrated circuit element to the metallized layer 32 for lead distribution as the figure pattern printed on the third green ceramic sheet 30.

Further, the fourth green ceramic sheet 40 has metallized layers 44 for auxiliary lead members extending from the layer 42 for the plating of the latter layers and holes 49 in register with the holes 47 of the first green ceramic sheet 10, the holes 48 of the second green ceramic sheet 20 and the holes 34 of the third green ceramic sheet 30. Moreover, on the upper surface of the fourth green ceramic sheet 40 are printed metallized marks 45 for the formation of snap lines and another metallized marks 46 for the formation of the green ceramic strips in connection with the printed pattern of the first green ceramic sheet 10.

Figure 6:
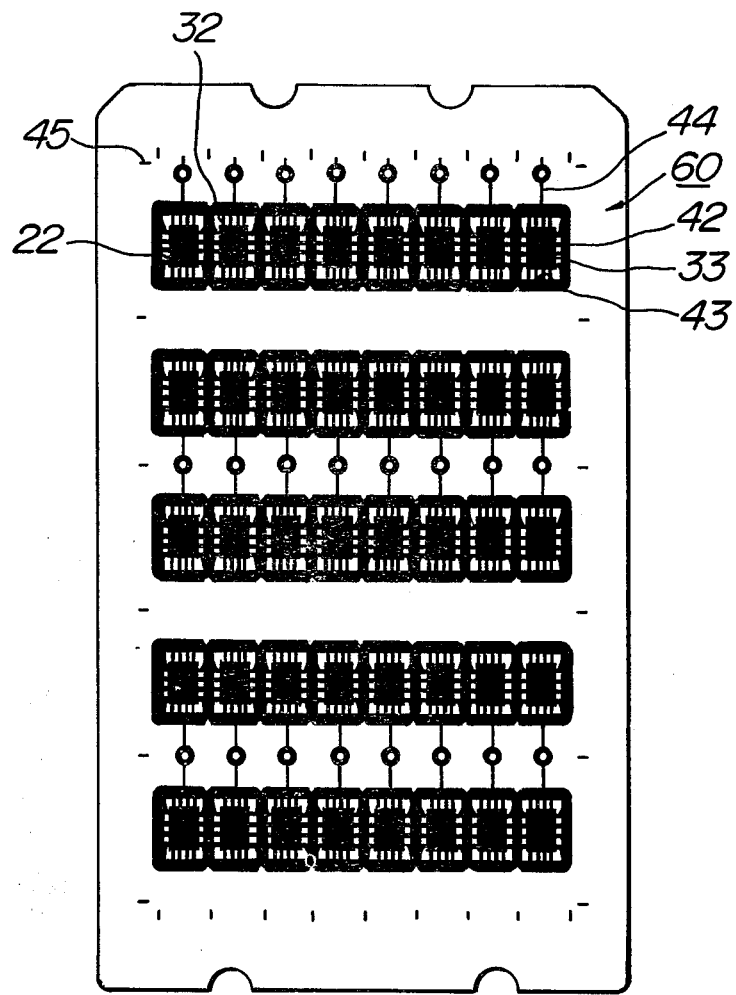
FIG. 6 is a plan view of a laminated body formed by laminating the first, second, third and fourth green ceramic sheets one upon another according to the present invention.

The first, second, third and fourth green ceramic sheets 10, 20, 30 and 40 each having a desirable printed pattern are laminated one upon another in this order while aligning these green ceramic sheets with the aid of the notches 11, 21, 31 and 41, and then the resulting assembly is heated at a temperature of about 150° C. under pressure by means of a hot press to form a laminated body 60 as shown in FIG. 6.

As apparent from the laminated body 60 shown in FIG. 6, the cavity for accommodating the integrated circuit element therein is defined by the recess 33 of the third green ceramic sheet 30, the recess 43 of the fourth green ceramic sheet 40 and the metallized layer 22 for mount of the second green ceramic sheet 20. When the thickness of the integrated circuit element to be accommodated is more thick, the depth of the cavity can be adjusted by inserting an auxiliary green ceramic sheet having recesses of given opening area between the second and third green ceramic sheets 20, 30 or the third and fourth green ceramic sheets 30, 40.

Then, the laminated body 60 is subjected to knife-cutting, where snap lines 50 are transversally provided along the marks 13 (or 45) and at the same time, the laminated body 60 is longitudinally cut along the marks 14 (or 46) to form green ceramic strips 70 each constituting a plurality of individual ceramic package units which are connected with each other as shown in FIG. 7.

On both sides of each of the green ceramic strips 70 is printed a lead contact pattern constituting lead contacts 71 for the attachment of lead members as shown in FIG. 7, through which the metallized layer 32 for lead distribution is electrically connected to the corresponding metallized layer 12 for terminal portion, with a metallizing ink. This side printing can easily be carried out by the same manner as mentioned on the printing of the lead array pattern. Moreover, the metallizing ink used is the same as described above.

After the completion of the side-printing, the green ceramic strip 70 is placed in a sintering furnace and then sintered at a temperature of about 1,500° to 1,600° C. under a reducing atmosphere in the conventional manner.

The thus obtained ceramic strip (80) is plated in a nickel plating bath in the conventional manner, whereby nickel layers are deposited on the metallized layers 12, 15, 22, 23, 42 and 44.

Then, lead members are attached to nickel-plated lead contacts 71 formed on both sides of the ceramic strip (80). The attachment of the lead member is carried out by providing a lead frame 81 of comb-type corresponding to the lead contact pattern and soldering each teeth end 82 of the comb-type frame to each of the corresponding lead contacts 71 in the conventional manner as shown in FIG. 8.

Next, the ceramic strip provided with the lead frames is plated in a gold plating bath in the conventional manner to deposit gold layers on the nickel plated layers and lead frames, whereby connection-type ceramic packages 80 as shown in FIG. 8 is obtained.

In the use of the ceramic packages 80, the lead frame may be cutted so as to correspond the number of the lead members to the terminal areas of the integrated circuit element and thereafter the ceramic packages may be divided into individual ceramic package units through the snap lines 50. Therefore, the integrated circuit elements can be accommodated in the ceramic packages of connected state or individually divided state. Further, a plurality of ceramic package units can be produced in a connected state, so that the yield per green ceramic sheet is considerably increased as compared with the prior art. The handling and packing of the ceramic package units are very easy.

What is claimed is:

1. A method of manufacturing connection-type ceramic packages for integrated circuits, each package having a cavity for accommodating an integrated circuit element therein, which comprises the steps of
   (a) preparing a plurality of green ceramic sheets to be laminated;
   (b) punching said green ceramic sheets to form notches for determining a working position in each sheet and recesses each defining said cavity at predetermined positions in each of given green ceramic sheets;
   (c) printing a plurality of patterns of lead array, each pattern corresponding to terminal areas of said integrated circuit element, on the surface of each of the green ceramic sheets with a metallizing ink;
   (d) laminating these printed green ceramic sheets one upon another while aligning said green ceramic sheets with the aid of said notches under hot pressed condition to form a green ceramic laminated body;
   (e) providing transverse snap lines for obtaining individual ceramic package units on the surface of said green ceramic laminated body and at the same time longitudinally cutting said green ceramic laminated body into a plurality of green ceramic strips each constituting a plurality of said individual ceramic package units which are connected with each other;
   (f) printing a pattern corresponding to said lead array pattern on both sides of each of said green ceramic strips with a metallizing ink;
   (g) sintering said green ceramic strips to ceramic strips;
   (h) subjecting said ceramic strips to a usual plating treatment; and
   (i) attaching lead members to each of said plated ceramic strips to form connection-type ceramic packages capable of being divided into individual ceramic package units in use.

2. A method as claimed in claim 1, wherein said metallizing ink is selected from tungsten paste and molybdenum paste.

3. A method as claimed in claim 1, wherein said laminated body has an auxiliary green ceramic sheet for adjusting the depth of the cavity in compliance with the thickness of the integrated circuit element to be accommodated.

4. A method as claimed in claim 1, wherein said plating is carried out in a nickel plating bath.